United States Patent
Mazzaro et al.

(10) Patent No.: US 10,564,280 B2
(45) Date of Patent: Feb. 18, 2020

(54) METHOD AND APPARATUS FOR DETECTING OBJECTS USING A COMBINATION OF RADIO AND ACOUSTIC SIGNALS

(71) Applicant: U.S. Army Research Laboratory, Adelphi, MD (US)

(72) Inventors: Gregory J. Mazzaro, Charleston, SC (US); Kyle A. Gallagher, Silver Spring, MD (US); Kelly D. Sherbondy, Burke, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/040,597

(22) Filed: Jul. 20, 2018

(65) Prior Publication Data
US 2020/0025915 A1    Jan. 23, 2020

(51) Int. Cl.
| | | |
|---|---|---|
| *G08B 26/00* | (2006.01) | |
| *G01S 15/02* | (2006.01) | |
| *G01S 13/04* | (2006.01) | |
| *G01R 23/165* | (2006.01) | |
| *G01S 13/86* | (2006.01) | |

(52) U.S. Cl.
CPC .......... *G01S 15/025* (2013.01); *G01R 23/165* (2013.01); *G01S 13/04* (2013.01); *G01S 13/862* (2013.01)

(58) Field of Classification Search
CPC ........ G01S 15/025; G01S 15/04; G01S 15/00; G01N 29/11; G01N 29/40; G01N 29/00; G01V 1/001

USPC ........ 340/505, 518, 554, 566; 367/124, 149, 367/93; 73/587, 620, 627
See application file for complete search history.

(56) References Cited

U.S. PATENT DOCUMENTS

| | | | | |
|---|---|---|---|---|
| 5,974,881 A | * | 11/1999 | Donskoy ................ | G01N 29/11 367/87 |
| 6,415,666 B1 | | 7/2002 | Donskoy et al. | |
| 7,073,384 B1 | * | 7/2006 | Donskoy ............ | G01N 29/2412 356/5.11 |
| 9,599,576 B1 | * | 3/2017 | Portune .................. | G01N 22/02 |

OTHER PUBLICATIONS

Mazzaro, et al.; "Nonlinear Radar for Finding RF Electronics: System Design and Recent Advancements"; IEEE Transactions on Microwave Theory and Techniques, vol. 65, No. 5, May 2017; pp. 1716-1726.

(Continued)

*Primary Examiner* — Toan N Pham
(74) *Attorney, Agent, or Firm* — Alan I. Kalb (57) ABSTRACT

A method and apparatus for detecting an object comprising a radio frequency transmitter for transmitting a radio frequency signal towards an object; an acoustic signal transmitter for transmitting an acoustic signal capable of causing intermittent contact of conductive and/or semi-conductive junctions of the object; and a radio frequency receiver for receiving the radio frequency signal after the radio frequency signal is reflected from the object, where the received radio frequency signal has been altered by the intermittent contact of conductive and/or semi-conductive junctions of the object.

10 Claims, 7 Drawing Sheets

(56) References Cited

OTHER PUBLICATIONS

Bokar, et al.; "Reflection of Electromagnetic Waves from Oscillating Surfaces"; IEEE Transactions on Antennas and Propagation, Jan. 1975; pp. 122-127.

Wetherington, et al.; "Standoff Acoustic Modulation of Radio Frequency Signals in a Log-Periodic Dipole Array Antenna"; IEEE Antennas and Wireless Propagation Letters, vol. 11, 2012; pp. 885-888.

Cooper; "Scattering of Electromagnetic Fields by a Moving Boundary: The One-Dimensional Case"; IEEE Transactions on Antennas and Propagation, vol. AP-28, No. 6, Nov. 1980; pp. 791-795.

Van Bladel, et al.; "Reflections from Linearly Vibrating Objects: Plane Mirror at Normal Incidence"; IEEE Transactions on Antennas and Propagation; vol. AP-29, No. 4, Jul. 1981; pp. 629-637.

Sarabandi, et al.; "Acoustic and Electromagnetic Wave Interaction: Estimation of Doppler Spectrum From an Acoustically Vibrated Metallic Circular Cylinder"; IEEE Transactions on Antennas and Propagation, vol. 51, No. 7, Jul. 2003; pp. 1499-1507.

Scott, et al.; "Investigation of a Technique that Uses Elastic Waves to Detect Buried Land Mines"; Conference: Geoscience and Remote Sensing Symposium, 2000; IEEE 2000 International, vol. 4; 3 pages.

Scott, et al.; "Simultaneous Use of Elastic and Electromagnetic Waves for the Detection of Buried Land Mines"; Proceedings of SPIE, vol. 4038, Apr. 2000; pp. 667-678.

Lawrence, et al.; "Acousto-Electromagnetic Interaction in the Detection of Buried Objects"; IGARSS 2001; Scanning the Present and Resolving the Future; Proceedings; IEEE 2001 International Geoscience and Remote Sensing Symposium (Cat. No. 01CH37217); pp. 1989-1991.

Bahr, et al.; "Radar Scattering from Intermittently Contacting Metal Targets"; IEEE Transactions on Antennas and Propagation, vol. AP-25, No. 4, Jul. 1977; pp. 512.

Mazzaro, et al.; "Linear amplification by time-multiplexed spectrum"; Published in IET Circuits, Devices & Systems; Apr. 27, 2010; pp. 392-402.

Bahr, et al.; "On the RF Frequency Dependence of the Scattered Spectral Energy Produced by Intermittent Contacts Among Elements of a Target"; IEEE Transactions on Antennas and Propagation, vol. AP-26, No. 4, Jul. 1978; pp. 618-621.

Stockman, et al.; "Doppler Radar Detection of Mechanically Resonating Objects"; 2005 IEEE Antennas and Propagation Society International Symposium; pp. 130-133.

* cited by examiner

METHOD AND APPARATUS FOR DETECTING OBJECTS USING A COMBINATION OF RADIO AND ACOUSTIC SIGNALS

GOVERNMENT RIGHTS IN THIS DISCLOSURE

Governmental Interest—The invention described herein may be manufactured, used and licensed by or for the U.S. Government. Research underlying embodiments of the present invention was sponsored by the U.S. Army Research Laboratory (ARL).

BACKGROUND OF THE INVENTION

Field of the Invention

Embodiments of the invention generally relate to object (target) detection and, more particularly, to a method and apparatus for detecting objects using a combination of radio and acoustic signals.

Description of the Related Art

Typically, radar is used to detect and identify objects through transmission of an electromagnetic signal in the direction of an object (target) and an analysis of the electromagnetic signal reflected from the object. Through analysis of the reflected signal an object's position, size, shape, and other attributes are readily identified. When small man-made objects which contain electronics are interrogated using radar, the signal transmitted from the radar is non-linearly transformed by elements of the target object into a spectrum of electromagnetic radiation that is re-radiated (reflected) from the target object. The reflected waveform is analyzed to detect the target object. However, such radar systems can be inaccurate when differentiating small targets.

Consequently, there is a need in the art for a method and apparatus that is capable of detecting objects containing circuitry or other electronic components. Such a system would enable the detection of land mines, improvised explosive devices, communications devices, surveillance devices, cell phones, and the like.

SUMMARY OF THE INVENTION

Embodiments of the invention include an apparatus and a method for detecting an object comprising a radio frequency transmitter for transmitting a radio frequency signal towards an object; an acoustic signal transmitter for transmitting an acoustic signal capable of causing intermittent contact of conductive and/or semi-conductive junctions of the object; and a radio frequency receiver for receiving the radio frequency signal after the radio frequency signal is reflected from the object, where the received radio frequency signal has been altered by the intermittent contact of conductive and/or semi-conductive junctions of the object.

Other and further embodiments of the present invention are described below.

BRIEF DESCRIPTION OF THE DRAWINGS

So that the manner in which the features of various embodiments of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiment of the present invention comprise a method and apparatus for detecting an object (target) using a combination of acoustic and radio frequency (RF) signals. The acoustic signal is transmitted at an object and causes a physical change of the object, i.e., the object and its internal components are vibrated. The radio frequency signal that is re-radiated from the object is altered by the physical change induced in the object by the acoustic signal. Through analysis of the re-radiated RF signal, the object can be detected. Additionally, the re-radiated RF signal may contain a unique signal signature that enables the object to be identified.

Figure 1:
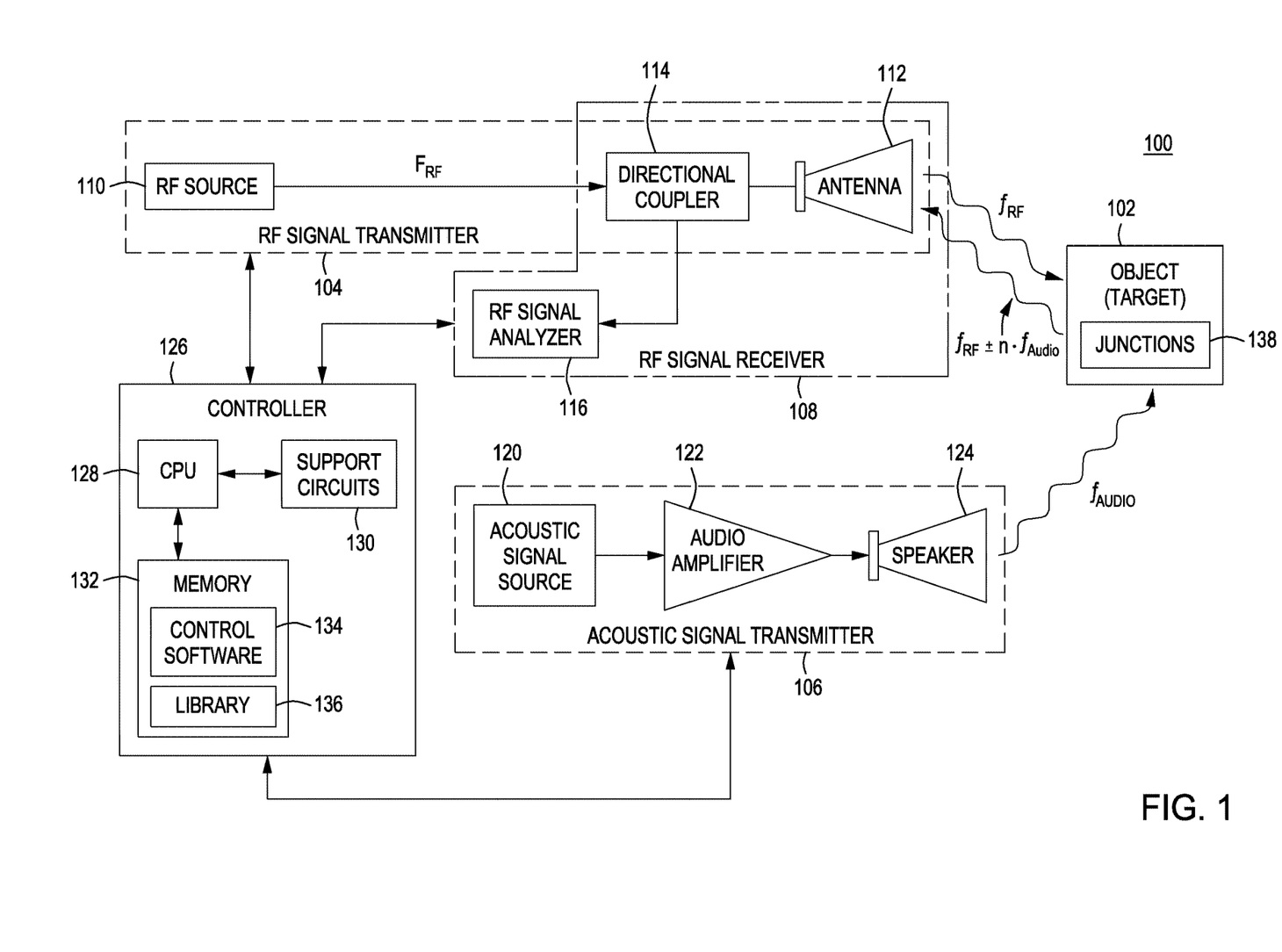
FIG. 1 is a block diagram of an apparatus for detecting an object in accordance with an embodiment of the invention.

FIG. 1 is a block diagram of an apparatus (also referred to as an acoustic radar or a hybrid radar) 100 for detecting an object 102 in accordance with at least one embodiment of the invention. The apparatus 100 comprises a radio frequency (RF) signal transmitter 104, an acoustic signal transmitter 106 and an RF signal receiver 108. The RF signal transmitter and receiver may be combined into a single unit as a transceiver.

The RF signal transmitter 104 comprises an RF source 110 such as an oscillator and amplifier and an antenna 112.

If the transmitter 104 and receiver 108 are combined as a transceiver, a directional coupler 114 is located between the antenna 112 and the RF source 110 to direct the transmitted signal from source 110 to the antenna 112 and direct a received RF signal to the RF signal receiver 108. The RF signal receiver 108 comprises an RF signal analyzer 116. The analyzer 116 comprises components tho analyze the spectrum of the received RF signal. These components may include, as is well known by those skilled in the art, digitizing components, filters, downconverter(s), amplifiers, and/or computer components to analyze the digitized received RF signal.

The acoustic signal transmitter 106 comprises an acoustic signal source 120, an audio amplifier 122 and a speaker 124. The acoustic signal frequency is generally tuned to a frequency commensurate with the expected size of the target object as further described below.

In one embodiment, the acoustic signal is a single frequency $f_{AUDIO}$ (e.g., 100 Hz to 1000 Hz, other frequencies may be used depending on the object being detected) that propagates through air or an obscured target medium (e.g., soil, foliage and wall materials) between the acoustic signal transmitter 106 and the object 102. In one embodiment of the invention, a typical RF signal includes a single frequency $f_{RF}$ (e.g., frequencies in the range of 800 MHz to 2 GHz at an output power of approximately 0 dBm). Those skilled in the art will understand that other frequencies could be used in other embodiments.

The apparatus 100 further includes a controller 126 for controlling the function of the RF signal transmitter 104, the RF signal receiver 108 and the acoustic signal transmitter 106. Typically, the controller 126 comprises a central processing unit (CPU) 128, support circuits 130 and memory 132. The CPU 128 is typically a microprocessor or microcontroller that is capable of controlling the apparatus 100 as described herein. The support circuits comprise well-known circuits that support the function of the CPU 128 such as power supplies, oscillators, input/output circuits, and the like. The memory 132 comprises read only and/or random access memory storing control software 134 for controlling the operation of the apparatus 100 and an optional library 136 of signals that are used for target device identification, as described below.

Figure 2:
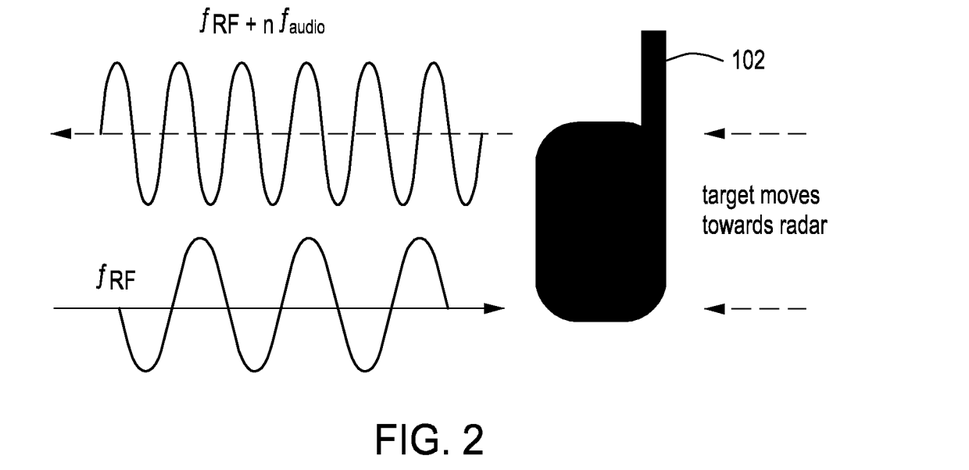
FIG. 2 graphically represents a frequency shift occurring as an object moves toward an RF signal receiver.
Figure 3:
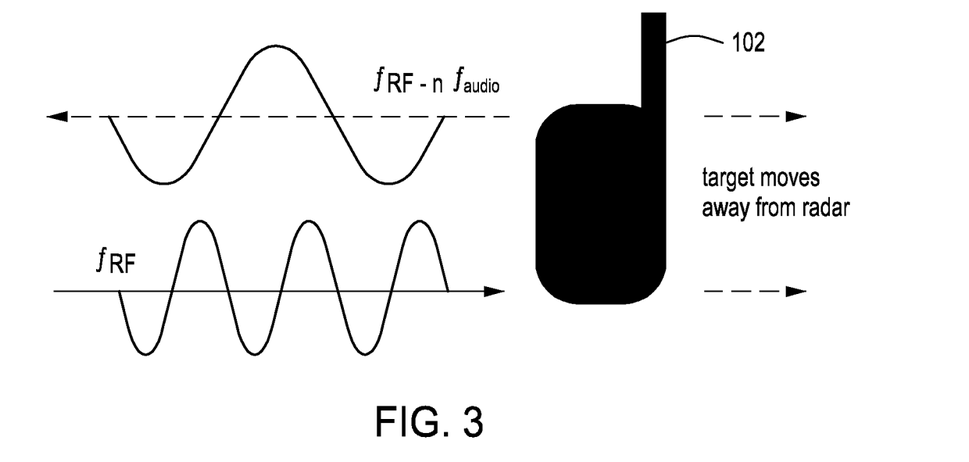
FIG. 3 graphically represents a frequency shift occurring as an object moves away from an RF signal receiver.
Figure 4:
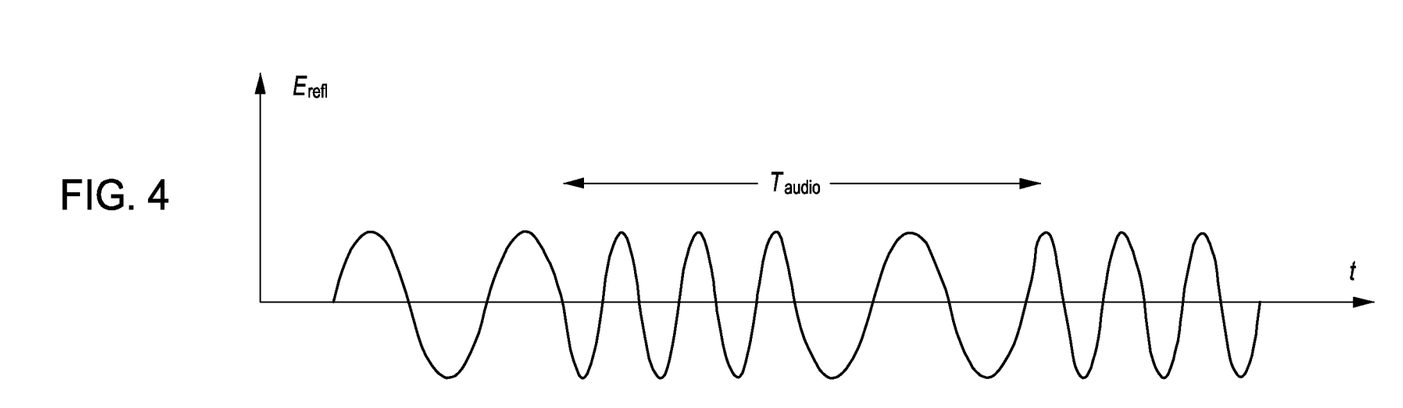
FIG. 4 is a time domain representation of the reflected RF signal produced by a sinusoidally oscillating object.
Figure 5:
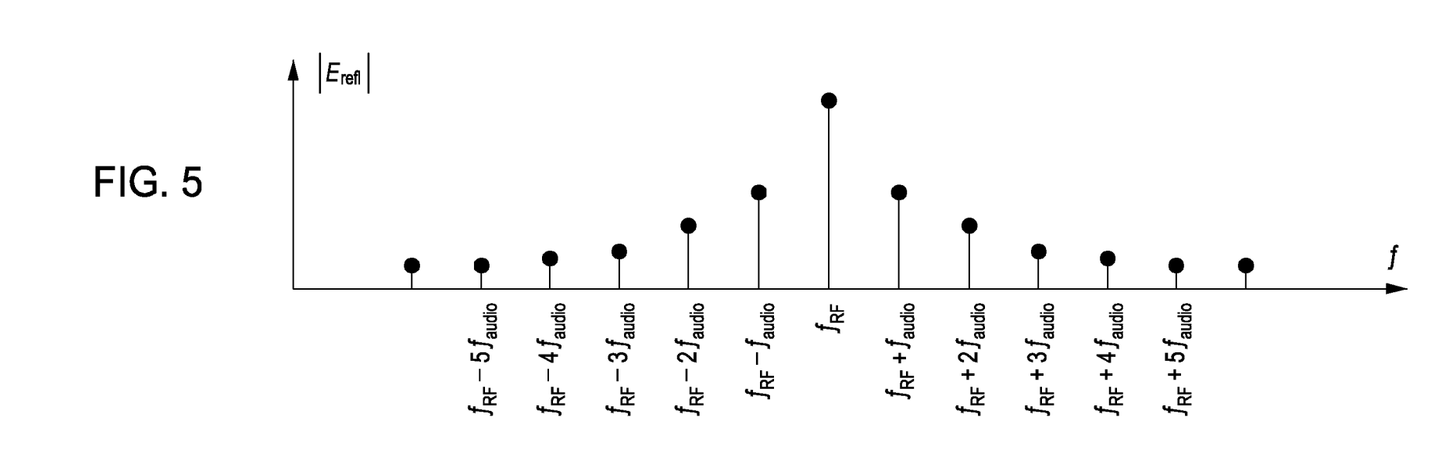
FIG. 5 is a frequency domain representation of the reflected RF signal produced by a sinusoidally oscillating object.

As represented in FIGS. 2 and 3, the RF signal contacts the object as a plane wave and the audio signal imparts a translational motion in the object (target) 102. As the RF signal impacts the moving object 102, a sinusoidal modulation is imparted to the RF signal that is re-radiated from the object. The reflected electric field has the form show in Equation 1:

$$E_{refl}(t)=E_0 \cos(2\pi f_{RF} t + k \cdot v_0 \cdot t) \quad [1]$$

where $E_0$ is the electric field amplitude, k is the RF wave number, and $v_0$ is the velocity of the object 102 towards the receiver. If the acoustic signal is a single tone (i.e., a sinusoid), then the object 102 sinusoidally oscillates when impacted with the acoustic signal. The reflected electric field then has the form of Equation 2:

$$E_{refl}(t)=E_0 \cos(2\pi f_{RF} t + k \cdot d_0 \sin 2\pi f_{AUDIO} t) \quad [2]$$

where $d_0$ is the maximum displacement of the target surface directly towards the receiver (with respect to the initial or "unvibrated" position). Since the time-derivative of the of the phase of $E_{refl}$ is generally non-zero, the perturbation imparted by the acoustic signal on the target object 102, as a result of sinusoidally moving the target object 102 toward and away from the receiver, is frequency modulation (FM). In essence, the audio frequency modulates the RF signal. FIG. 4 depicts the reflected RF signal in the time domain—note the frequency modulated upon the RF signal.

In the Fourier domain, sinusoidal motion produces a spectral spreading wider than that predicted by a Doppler shift alone. This spreading extends both above and below $f_{RF}$. Since the perturbation of the return signal results in frequency modulation, the frequency domain representation of $E_{refl}$ is expressed as a series of Fourier components whose amplitudes are Bessel coefficients. Such a representation is shown in Equation 3:

$$E_{refl}(f_{RF}+n\Delta f_{AUDIO})=E_0 J_n(k \cdot d_0), n \neq 0 \quad [3]$$

The degree of modulation, and thus the total energy spread across the $n \neq 0$ sidebands, depends on the value of $d_0$. FIG. 4 represents the Fourier components of Equation 3 in graphical form.

Embodiments of the present invention exploit certain characteristics of the object such that the apparatus 100 enhances detection of the object 102. Using audio to vibrate the target object 102 causes intermittent contact between conductive and/or semi-conductive junctions 138 within the target object 102. Inside the targets that are detectable by embodiments of the invention, there are junctions 138 (e.g. between electrical components, wires, antennas, traces along printed circuit boards, solder joints, case seams, fastener (e.g., rivet and/or screw) contact area and the like) where conductive materials (either metals or semiconductors) meet. As the acoustic wave vibrates the target 102, such junctions 138 are compressed-and-expanded while others are connected-and-disconnected. When a metallic or electronic target object vibrates while being illuminated with an RF signal, the reflected signal contains not only the Doppler shift due to displacement of the target surface (e.g., equation 3), but also contains additional spectral content resulting from the connecting and disconnecting junctions. In one embodiment of the invention, this additional content is analyzed as a signature or "finger print" of the target object 102.

The additional acoustic modulation is modeled as a periodic connection and disconnection of dipole antennas along the target surface, where each dipole radiates at $f_{RF}$. Equations 4 and 5 represent the intermittent contact as a square-wave multiplication of the original (Doppler-related) reflected signal of Equation 2.

$$E_{refl}(t)=E_0 \cos(2\pi f_{RF} t)s(t) \quad [4]$$

$$\text{where } s(t)=[u(t)-\alpha u(t-\beta T_{AUDIO})]=s(t-T_{AUDIO}) \quad [5]$$

In Equation 5, s(t) is a switching waveform that repeats with period $T_{AUDIO}=1/f_{AUDIO}$. The real coefficient $\alpha$ is a value between 0 and 1 which quantifies the difference in amplitude of $E_{refl}$ between conductive junctions being mostly connected versus mostly disconnected with the target object during the period $T_{AUDIO}$. The coefficient $\beta$ is another real value between 0 and 1 which quantifies the fraction of $T_{AUDIO}$ during which most conductive junctions are connected. Thus, by vibrating the target to cause intermittent metal-metal contact, the modulation imparted onto the original, sinusoidally moving target is amplitude modulation.

If the junctions are randomly oriented across the target with respect to the axis along which the target is vibrated, then the expected value of β is 0.5, although this value will fluctuate over multiple periods of the acoustic wave. Derived from the Fourier transform of the RF pulse, the frequency content of the sidebands may be expressed as Equation [6].

$$\tilde{E}_{refl}(f_{RF} + nf_{AUDIO}) = E_0 \frac{\alpha \sin(\beta \cdot n\pi)}{n}, n \neq 0 \quad [6]$$

Figure 6:
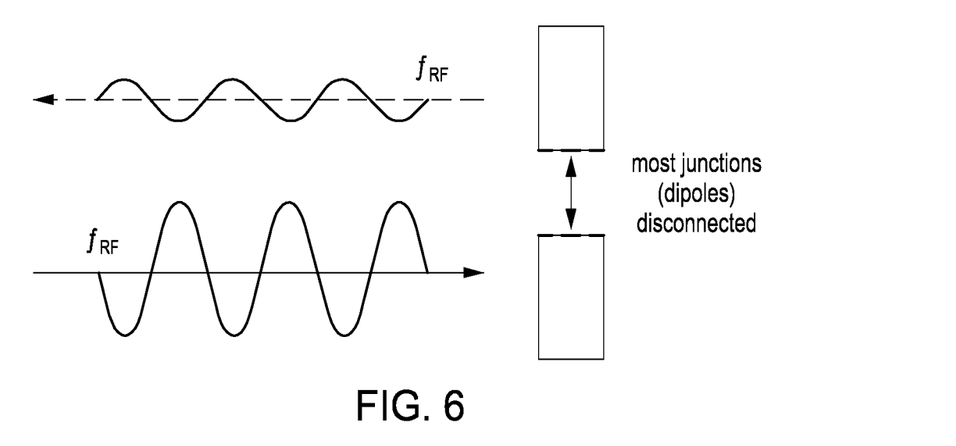
FIG. 6 graphically represents amplitude modulation of an incident RF signal occurring when most junctions of an object are disconnected.
Figure 7:
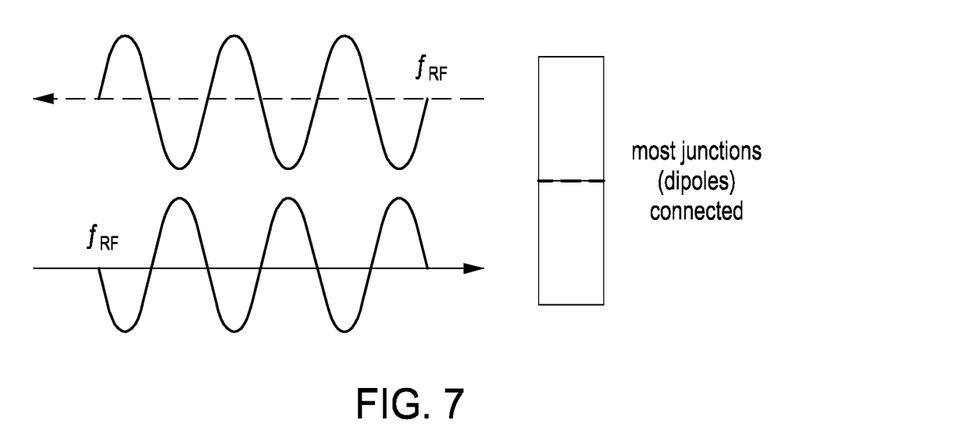
FIG. 7 graphically represents amplitude modulation of an incident RF signal occurring when most junctions of an object are connected.
Figure 8:
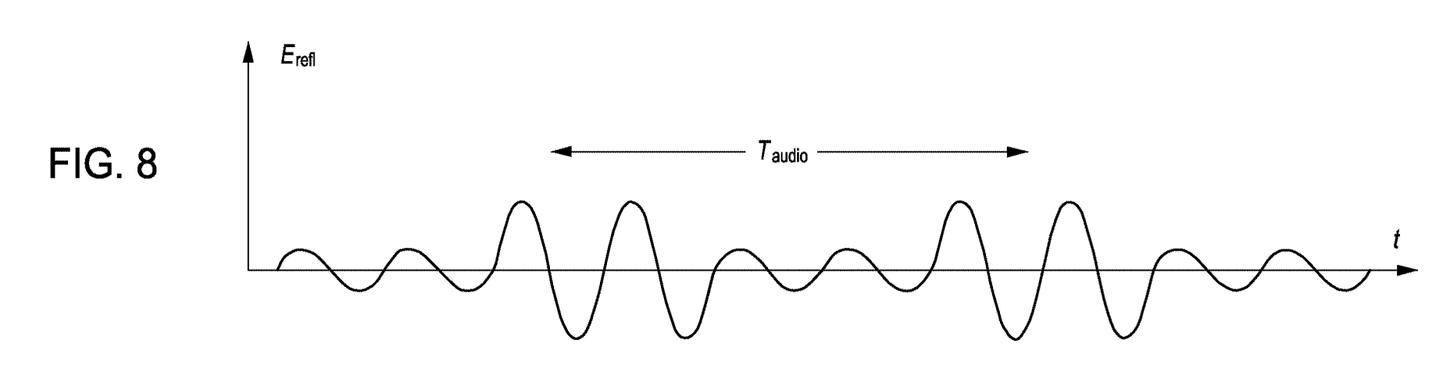
FIG. 8 is a time domain representation of the reflected RF signal produced by an object having conductive and/or semi-conductive junctions connected and disconnected.
Figure 9:
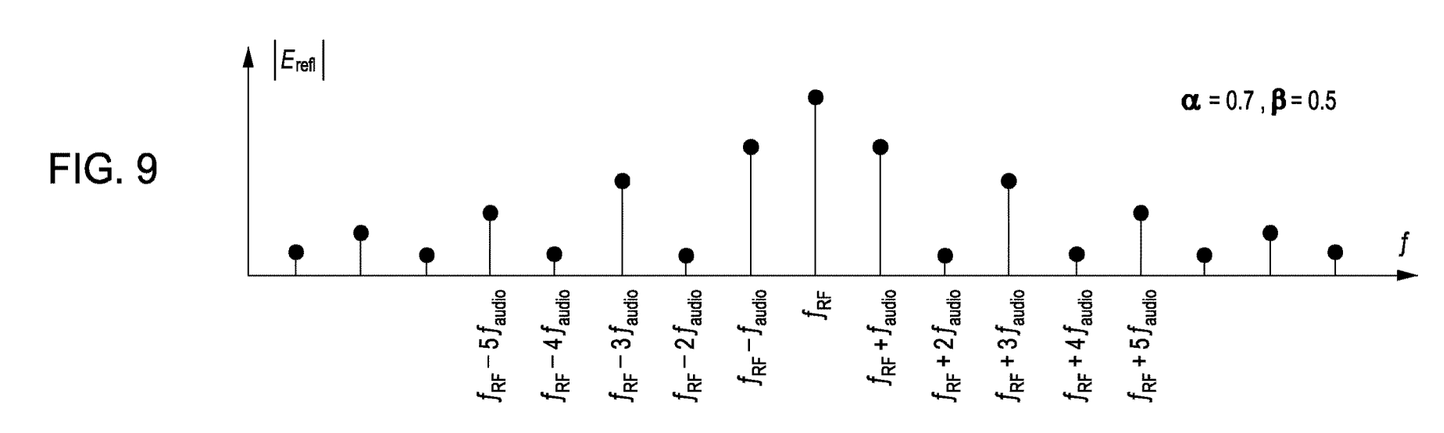
FIG. 9 is a frequency domain representation of the reflected RF signal produced by an object having conductive and/or semi-conductive junctions connected and disconnected.

FIG. 6 represents the reflected RF signal as compared to the incident RF signal, when a junction is disconnected, while FIG. 7 represents the reflected RF signal as compared to the incident RF signal, when a junction is connected. FIG. 8 is a time-domain representation of the amplitude-modulated signal resulting from vibrating a metallic or electronic object. FIG. 9 is the Fourier spectrum representation of the amplitude modulated signal resulting from vibrating a metallic or electronic object. The degree of modulation depends on the difference between the minimum and maximum load (surface) impedance, which physically corresponds to the difference between the number of conductive junctions that are connected versus those that are disconnected along/inside the target at any one time.

To maximize the unmodulated carrier wave amplitude received by the receiver, the wavelength of the RF transmission $\lambda_{RF}$ is matched to the length of a typical junction within the electronic target: $\lambda_{RF} = c_{RF}/2f_{RF} = l_{junction}$, where $c_{RF}$ is the speed of an electromagnetic wave in air. Here it is assumed that a conductive junction behaves as a dipole antenna which radiates most efficiently when its length corresponds to half of an RF wavelength of the incident RF signal.

To maximize the amount of modulation imparted onto the reflected RF signal at the target, the wavelength of the acoustic transmission $\lambda_{audio}$ is matched to at least one physical dimension of the (shell of) the target: $\lambda_{audio}/2 = c_{audio}/2f_{audio} = l_x$ where $c_{audio}$ is the speed of an acoustic wave in air and $l_x$ is the length along any one dimension (length, width, height) of the target.

If the antenna and the speaker are located in close proximity, then range-to-target from the radar to the electronic device may be determined from the one-way time-of-flight:

$$d = \Delta t/c_{audio} \quad [7]$$

where $c_{audio}$ is 343 m/s in dry air and $\Delta t$ is the time between the (initial) transmission of the acoustic wave from the speaker and the (initial) reception of the modulation of the RF carrier wave by the receiver. The total time-of-flight of the received audio modulation equals the acoustic-wave travel time from the speaker to the target plus the RF signal travel time from the target to the antenna. However, since $c_{RF} \gg c_{audio}$, it may be assumed that the RF signal is emitted from the target and received back at the receiver instantaneously, and the time-of-flight of the acoustic modulation is dominated by the one-way transit time of the acoustic wave from the speaker to the target.

Figure 10:
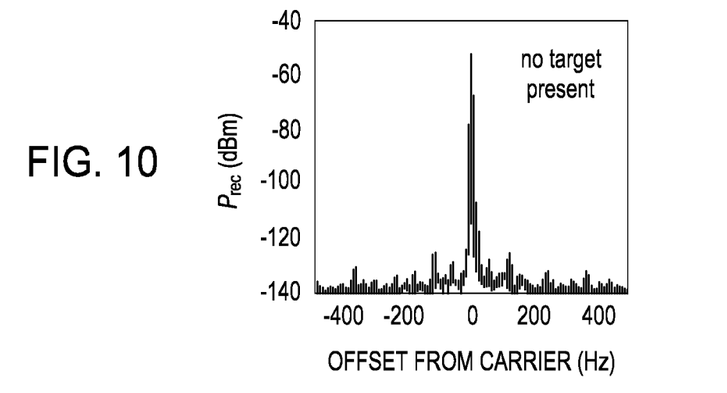
FIGS. 10, 11 and 12 respectively represent radio frequency signal signatures when no object is present and when two different objects have been probed with the same RF and acoustic signals.

FIG. 10 represents a signal spectra that is received when no target is present. Samples of signal spectra received from targets-of-interest are given in FIGS. 11 and 12. Inside each recorded trace, the amplitude-modulated frequency spectrum consists of the carrier $f_{RF}$ in the center of the spectrum with stems/"spikes" of frequency content at integer multiples of $f_{audio}$ away from the carrier. Thus, if the received spectrum consists of measurable spectral content at $f_{RF} \pm n \cdot f_{audio}$ (where n is any whole number), then a conductive junction is detected and the presence of a target-of-interest is implied.

Figure 11:
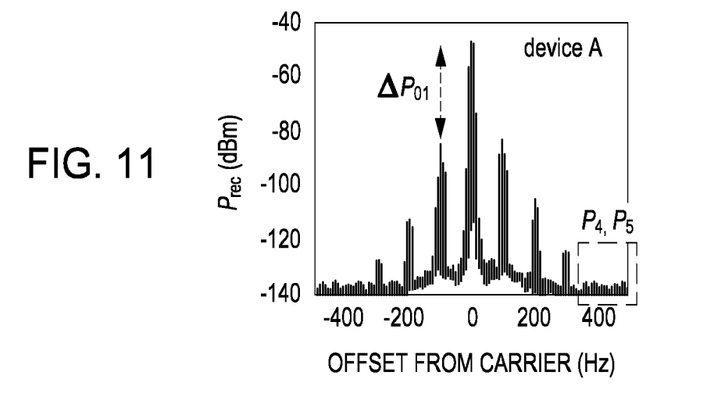
Figure 12:
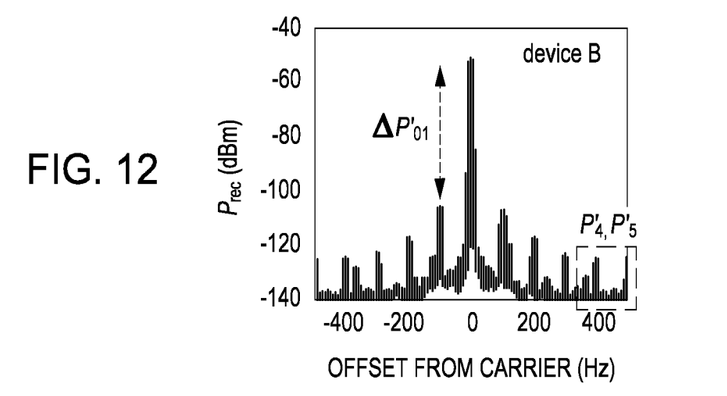

The spectra recorded from particular targets, such as "device A" in FIG. 11 and "device B" in FIG. 12, may be used to uniquely identify the devices. Experimental data taken using an embodiment of the invention (for a given radio frequency, audio frequency, and transmit power) shows that targets react differently when illuminated by the same RF and acoustic signal combination. The data shown in FIGS. 11 and 12 was taken using two different electronic devices, with each device at a distance of 2 ft from the antenna, with an RF transmit power of 1 mW, at an RF carrier frequency of $f_{RF}$=800 MHz and an audio frequency of $f_{audio}$=100 Hz. For comparison purposes, FIG. 10 depicts a trace that occurred when no device was present—note the lack of sidebands. The difference in power between the signal received at n=0 and n=1, labeled in FIGS. 11 and 12 as $\Delta P_{01}$, is approximately 35 dB for "device A" and approximately 50 dB for "device B". Comparing the power received at n=4 ($P_4$) and n=5 ($P_5$), very little signal is visible for "device A"; however, both spectral peaks rise significantly above the noise floor for "device B". As such, (a) a library of spectral responses ("signatures") for particular targets may be recorded across different combinations of $f_{RF}$ and $f_{audio}$, and (b) targets which are detected but whose characteristics are otherwise unknown may be identified by matching their received spectra with signatures contained in this pre-recorded library.

This embodiment of the invention exploits the fact that objects of interest such as radios, landmines, other forms of explosive devices contain conductive and semi-conductive junctions. In its broadest sense, embodiments of the invention are designed to detect any form of object that can be modeled as a plurality of dipole antennas, i.e., any object containing conductive or semi-conductive junctions.

Figure 13:
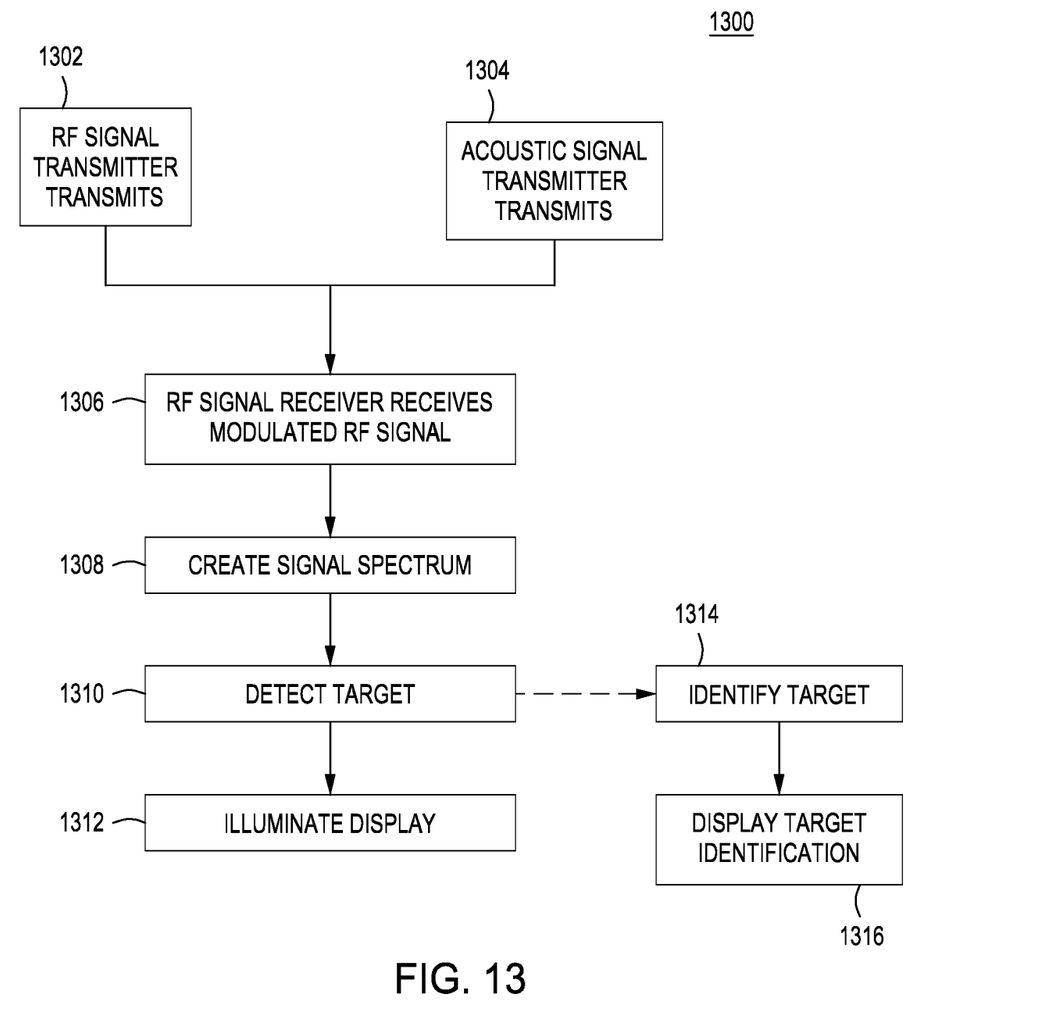
FIG. 13 is a flow diagram depicting the operation of the apparatus of FIG. 1 in accordance with an embodiment of the invention.

FIG. 13 is a flow diagram depicting one embodiment of a method 1300 of operation of the apparatus 100 of FIG. 1 in accordance with an embodiment of the invention. The operation may be implemented using the controller 126 by executing the control software 134 using CPU 128. At step 1302, the RF transmitter 104 transmits an RF signal toward an object (target) 102. Simultaneously, at step 1304, the acoustic transmitter 106 produces the acoustic signal. The acoustic signal causes a physical change in the target object such that the reflected RF signal is modulated by the physical change. At step 1306, the RF signal receiver receives the reflected signal and couples the signal to the RF signal analyzer 116.

At step 1308, the RF signal analyzer 116 creates a frequency spectrum representation of the received signal. At step 1310, the method 1300 analyzes the spectrum to detect whether the received signal spectrum has energy in locations indicating a target. At step 1312, a display of target detected or not may be illuminated.

Optionally, at step 1314, the method 1300 may identify the target through matching the received frequency spectrum to a database of known spectra of various detectable objects. If a spectrum match is found, at step 1316, the user is notified of the object identification. The user may be notified of the identity of the object, but this is not always necessary, especially in situations where only one type of object is to be detected (e.g., a land mine).

Embodiments of the invention may provide additional situational awareness to a user entering an environment where the presence of target(s) containing conductive junctions might indicate an enhanced threat level. Embodiments of the invention may be carried on a moving vehicle, as one portion of a multi-sensor platform that provides an enhanced ("augmented reality") view of the environment surrounding the vehicle.

While the foregoing is directed to embodiments of the present invention, other and further embodiments of the invention may be devised without departing from the basic scope thereof, and the scope thereof is determined by the claims that follow.

The invention claimed is:

1. An apparatus for detecting an object comprising:
   a radio frequency transmitter for transmitting a radio frequency signal towards the object;
   an acoustic signal transmitter for transmitting an acoustic signal capable of causing intermittent contact of conductive and semi-conductive junctions of the object; and
   a radio frequency signal receiver for receiving the radio frequency signal after the radio frequency signal is reflected from the object, where the received radio frequency signal has been altered by the intermittent contact of conductive and semi-conductive junctions of the object
   wherein the radio frequency signal receiver further comprises an RF signal analyzer for identifying the object from a signature of the received radio frequency signal,
   wherein the radio frequency signal has a frequency of between 800 MHz and 2 GHz,
   wherein the acoustic signal has a frequency of between 100 Hz and 1000 Hz,
   and, wherein a wavelength of the acoustic signal is matched to at least one physical dimension of the object.

2. The apparatus of claim 1 wherein a wavelength of the radio frequency signal is matched to the length of a typical conductive and semi-conductive junction of the object.

3. The apparatus of claim 1 wherein the radio frequency signal receiver comprises an RF analyzer for analyzing a radio frequency signal spectrum comprising both frequency and amplitude modulation caused by the acoustic signal impacting the object.

4. The apparatus of claim 1 wherein a wavelength of the acoustic signal and a wavelength of the radio frequency signal are selected in response to at least one dimensions of a conductive and semi-conductive junction.

5. The apparatus of claim 1 further comprising a library of signal spectra.

6. A method of detecting an object comprising:
   transmitting a radio frequency signal towards an the object;
   transmitting an acoustic signal capable of causing intermittent contact of conductive and semi-conductive junctions of the object; and
   receiving the radio frequency signal after the radio frequency signal is reflected from the object, where the received radio frequency signal has been altered by the intermittent contact of conductive and semi-conductive junctions of the object further comprising identifying the object from a signature of the received radio frequency signal
   wherein the radio frequency signal has a frequency of between 800 MHz and 2 GHz wherein the acoustic signal has a frequency of between 100 Hz and 1000 Hz and, wherein a wavelength of the acoustic signal is matched to at least one physical dimension of the object.

7. The method of claim 6 wherein a wavelength of the radio frequency signal is matched to the length of a typical conductive and semi-conductive junction of the object.

8. The method of claim 6 further comprising analyzing a radio frequency signal spectrum comprising both frequency and amplitude modulation caused by the acoustic signal impacting the object.

9. The method of claim 6 wherein a wavelength of the acoustic signal and a wavelength of the radio frequency signal are selected in response to at least one dimensions of a conductive and semi-conductive junction.

10. An apparatus for detecting and identifying an object comprising:
    a radio frequency transmitter for transmitting a radio frequency signal towards aft tine object;
    an acoustic signal transmitter for transmitting an acoustic signal capable of causing intermittent contact of conductive and semi-conductive junctions of the object; and
    a radio frequency signal receiver for: (a) receiving the radio frequency signal after the radio frequency signal is reflected from the object, where the intermittent contact of conductive and semi-conductive junctions of the object has created a frequency spectrum, and (b) analyzing the frequency spectrum of the received radio signal to identify the object
    further comprising a library of frequency spectra that are used by the radio frequency signal receiver to identify the object wherein a wavelength of the acoustic signal and a wavelength of the radio frequency signal are selected in response to at least one dimensions of a conductive and semi-conductive junction.

* * * * *